(12) United States Patent
Kim et al.

(10) Patent No.: US 9,504,138 B2
(45) Date of Patent: Nov. 22, 2016

(54) SEMICONDUCTOR DEVICE

(71) Applicant: Samsung Electronics Co., Ltd., Suwon-si, Gyeonggi-do (KR)

(72) Inventors: Jung-Hoon Kim, Hwaseong-si (KR); Jin-Hyuk Lee, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 218 days.

(21) Appl. No.: 14/446,289

(22) Filed: Jul. 29, 2014

(65) Prior Publication Data

US 2015/0131242 A1    May 14, 2015

(30) Foreign Application Priority Data

Nov. 12, 2013  (KR) .................. 10-2013-0137000

(51) Int. Cl.
| | |
|---|---|
| *H05K 1/02* | (2006.01) |
| *H01L 23/52* | (2006.01) |
| *H01L 23/36* | (2006.01) |
| *H05K 1/18* | (2006.01) |

(52) U.S. Cl.
CPC ............. *H05K 1/0207* (2013.01); *H01L 23/36* (2013.01); *H01L 23/52* (2013.01); *H05K 1/0206* (2013.01); *H01L 2224/16225* (2013.01); *H01L 2924/0002* (2013.01); *H01L 2924/3511* (2013.01); *H05K 1/0209* (2013.01); *H05K 1/181* (2013.01); *H05K 2201/10159* (2013.01); *H05K 2201/10371* (2013.01); *H05K 2201/10416* (2013.01)

(58) Field of Classification Search
CPC .. H05K 1/0204; H05K 1/0206; H05K 1/115; H05K 1/116; H05K 1/144; H05K 1/0298

USPC ............... 361/752, 753, 760, 761, 762, 790, 361/792–795, 799
See application file for complete search history.

(56) References Cited

U.S. PATENT DOCUMENTS

| | | | | |
|---|---|---|---|---|
| 3,272,909 A | * | 9/1966 | Freno ................... | H05K 1/0266 174/255 |
| 4,649,461 A | * | 3/1987 | Matsuta ............... | H05K 3/4641 174/51 |
| 4,739,453 A | * | 4/1988 | Kurokawa ........... | H05K 9/0039 174/250 |
| 4,873,764 A | * | 10/1989 | Grimm ................. | H05K 1/184 29/739 |
| 5,136,471 A | * | 8/1992 | Inasaka ............... | H01L 23/5385 174/255 |
| 5,303,119 A | * | 4/1994 | Hilbrink ............. | H01L 23/5383 174/255 |

(Continued)

FOREIGN PATENT DOCUMENTS

| | | |
|---|---|---|
| JP | H05189630 A | 7/1993 |
| JP | U629196 | 4/1994 |

(Continued)

*Primary Examiner* — Adrian S Wilson
(74) *Attorney, Agent, or Firm* — Renaissance IP Law Group LLP

(57) ABSTRACT

Embodiments of the inventive concept include a semiconductor device having a circuit board including a first outer layer, a contact region in the first outer layer, a second layer formed on an opposite side of the first outer layer, a via-hole, and a plurality of inner layers formed to be stacked between the first layer and the second layer. A case may accommodate the circuit board. The case may have a projection portion that is configured to come in contact with the circuit board in the contact region. The plurality of inner layers may include a ground layer. The first outer layer may be connected to the ground layer through a via-hole. The case may be connected to the ground layer through the first outer layer.

19 Claims, 16 Drawing Sheets

(56) References Cited

U.S. PATENT DOCUMENTS

| | | | |
|---|---|---|---|
| 5,313,015 A * | 5/1994 | Hoge | H01R 23/6873 174/250 |
| 5,434,747 A * | 7/1995 | Shibata | H05K 9/0039 174/51 |
| 5,508,885 A | 4/1996 | Ishimoto | |
| 5,834,705 A * | 11/1998 | Jonaidi | H05K 1/141 174/254 |
| 5,888,631 A * | 3/1999 | Sylvester | H01L 23/3735 174/256 |
| 5,982,630 A | 11/1999 | Bhatia | |
| 6,110,213 A * | 8/2000 | Vinciarelli | G06F 17/50 703/1 |
| 6,445,591 B1 * | 9/2002 | Kwong | H01L 25/0652 257/686 |
| 6,448,509 B1 | 9/2002 | Huemoeller | |
| 6,534,723 B1 * | 3/2003 | Asai | H01L 23/49811 174/255 |
| 7,365,006 B1 * | 4/2008 | Huemoeller | H01L 21/486 257/E23.062 |
| 7,670,962 B2 * | 3/2010 | Huemoeller | H01L 21/4857 257/E21.347 |
| 7,692,927 B2 | 4/2010 | Jin et al. | |
| 7,709,966 B2 * | 5/2010 | Conn | H01L 21/486 257/690 |
| 7,768,789 B2 | 8/2010 | Ni et al. | |
| 7,872,876 B2 | 1/2011 | Koo et al. | |
| 2008/0170378 A1 * | 7/2008 | Ou-Yang | H05K 1/0201 361/799 |
| 2009/0301768 A1 * | 12/2009 | Liu | H05K 1/0215 174/257 |
| 2010/0246154 A1 * | 9/2010 | Tuen | H01R 23/6873 361/818 |
| 2013/0148319 A1 * | 6/2013 | Li | H05K 9/00 361/759 |
| 2014/0264935 A1 * | 9/2014 | Kurashina | H01L 24/81 257/774 |

FOREIGN PATENT DOCUMENTS

| | | |
|---|---|---|
| JP | H06309523 A | 11/1994 |
| JP | U737671 | 7/1995 |
| JP | H07282218 A | 10/1995 |
| KR | 101006063 B1 | 1/2011 |

* cited by examiner

SEMICONDUCTOR DEVICE

CROSS-REFERENCE TO RELATED APPLICATIONS

This application is based on and claims priority from Korean Patent Application No. 10-2013-0137000, filed on Nov. 12, 2013 in the Korean Intellectual Property Office, the disclosure of which is incorporated herein in its entirety by reference.

BACKGROUND

1. Field of the Inventive Concept

The present inventive concept relates to a semiconductor device.

2. Description of the Prior Art

As semiconductor devices become smaller in size and the integrity of the semiconductor device becomes heightened, heat generated from the semiconductor device must be cooled down to minimize thermal deformation of the semiconductor device. Particularly, in a Solid State Drive (SSD) device, heat generation due to high integration of a NAND flash memory may deteriorate reliability of the SSD. For heat dissipation, the semiconductor device, such as the SSD, may include a heat transfer material, such as a Thermal Interface Material (TIM), but a process for inserting the TIM into the semiconductor device is complicated, and in addition, providing the TIM is relatively expensive.

Japanese Patent Publication No. 1995-282218 discloses a semiconductor integrated circuit device.

SUMMARY

Embodiments of the inventive concept may include a semiconductor device, which can improve a heat dissipation effect using a circuit board and a case.

Other embodiments of the present inventive concept provide a semiconductor device, which can heighten stiffness of a circuit board.

Additional advantages, subjects, and features of the inventive concept will be set forth in part in the description which follows and in part will become apparent to those having ordinary skill in the art upon examination of the following or may be learned from practice of the inventive concept.

In one aspect of the present inventive concept, there is provided a semiconductor device, including a circuit board including a first outer layer, a contact region in the first outer layer, a second layer formed on an opposite side of the first outer layer, at least one via-hole, and a plurality of inner layers formed to be stacked between the first layer and the second layer. The semiconductor device may further include a case accommodating the circuit board, the case having a projection portion that is configured to come in contact with the circuit board in the contact region. The plurality of inner layers may include at least one ground layer. The first outer layer may be connected to the at least one ground layer through the at least one via-hole. The case may be connected to the at least one ground layer through the first outer layer.

In another aspect of the present inventive concept, there is provided a semiconductor device, including a circuit board including a first outer layer, a second layer formed on an opposite side of the first outer layer, and a plurality of inner layers formed to be stacked between the first layer and the second layer. A stiffener may penetrate the plurality of inner layers. A case including a first portion and a second portion may accommodate the circuit board. The first portion of the case may be configured to contact the first outer layer in a first contact region. The second portion of the case may be configured to contact the second outer layer in a second contact region that faces the first contact region. The case may be connected to a first ground layer and a second ground layer included in the plurality of inner layers through the first outer layer and the second outer layer, respectively. The stiffener may be formed between the first contact region and the second contact region In yet another aspect of the present inventive concept, a semiconductor device may include a circuit board including a first outer layer, a second outer layer, a plurality of inner layers, and a stiffener, and a case configured to accommodate the circuit board. The first outer layer may include a first contact region configured to contact the case. The second outer layer may include a second contact region configured to contact the case. The stiffener may be formed between the first outer layer and the second outer layer, and may penetrate the plurality of inner layers. The plurality of layers may include a plurality of ground layers and a plurality of signal layers. The stiffener may be connected to the plurality of ground layers and insulated from the plurality of signal layers.

BRIEF DESCRIPTION OF THE DRAWINGS

The above and other objects, features and advantages of the present inventive concept will be more apparent from the following detailed description taken in conjunction with the accompanying drawings, in which.

DETAILED DESCRIPTION OF THE EMBODIMENTS

Figure 1:
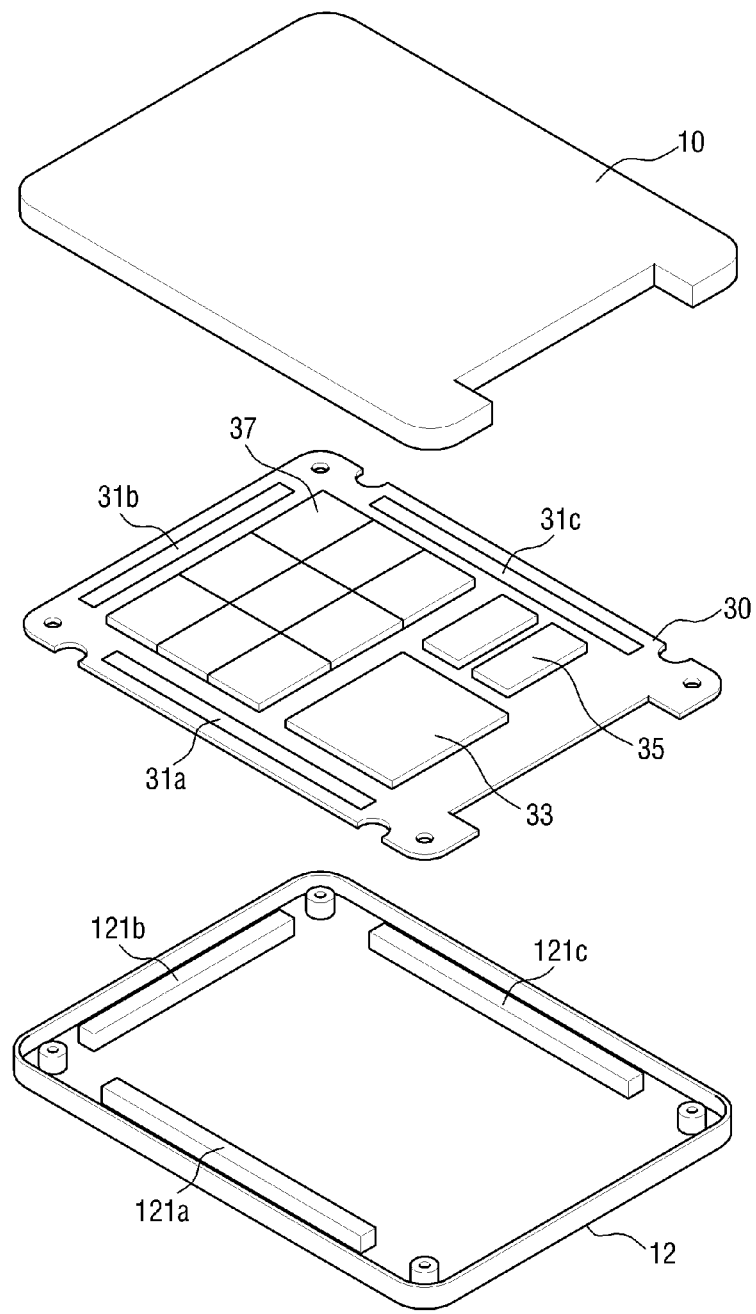
FIG. 1 is a view illustrating a semiconductor device according to the present inventive concept, which is applied to a SSD.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a semiconductor device according to embodiments of the present inventive concept is described with reference to the accompanying drawings.

FIG. 1 is a view illustrating a semiconductor device according to the present inventive concept, which is applied to a SSD.

Referring to FIG. 1, a semiconductor device includes a circuit board 30 and cases 10 and 12 accommodating the circuit board 30. Specifically, the semiconductor device may include at least one electronic device, such as a SSD controller 33, a buffer memory device 35, or a nonvolatile memory device 37, on the circuit board 30. In some embodiments of the present inventive concept, the circuit board 30 may be a Printed Circuit Board (PCB).

The SSD controller 33 may read data that is stored in the nonvolatile memory device 37 and transmit the read data to a host (not shown) in accordance with a read command that is received from the host. Further, the SSD controller 33 may store data that is transmitted from the host in the nonvolatile memory device 37 in accordance with a write command that is received from the host. In some embodiments of the present inventive concept, the SSD controller 33 may be connected to the host in a PCI Express (PCIe) interface method to exchange commands and data.

The buffer memory device 35 is to heighten the data transfer efficiency between the SSD controller 33 and the nonvolatile memory device 37. The buffer memory device 35 may be, for example, a Dynamic Random Access Memory (DRAM).

The nonvolatile memory device 37, which stores data, may be, for example, a flash memory, a Phase Change Random Access Memory (PRAM), or a Resistive Random Access Memory (RRAM), but is not limited thereto.

The cases 10 and 12 may be formed to surround the circuit board 30. As illustrated in FIG. 1, the cases 10 and 12 may be composed of two components including an upper plate and a lower plate, but are not limited thereto. The cases 10 and 12 may include projection portions 121a, 121b, and 121c formed on inner surfaces thereof, and the projection portions 121a, 121b, and 121c may come in contact with the circuit board 30 in contact regions 31a, 31b, and 31c, respectively, formed on the circuit board 30 to make the cases 10 and 12 come in contact with the circuit board 30. In some embodiments of the present inventive concept, the cases 10 and 12 may include a metal having superior thermal conductivity so that they can be soldered. For example, in some embodiments of the present inventive concept, the cases 10 and 12 may include copper (Cu) or a clad metal that is composed of copper (Cu) and aluminum (Al). In some embodiments of the present inventive concept, the projection portions 121a, 121b, and 121c may be made of the same material as the cases 10 and 12, or may be made of a material that is different from the material of the cases 10 and 12, but can be soldered and has superior thermal conductivity. It will be understood that while the term "cases" is used in the plural form, when joined together, the cases 10 and 12 may form a single "case."

Figure 2A:
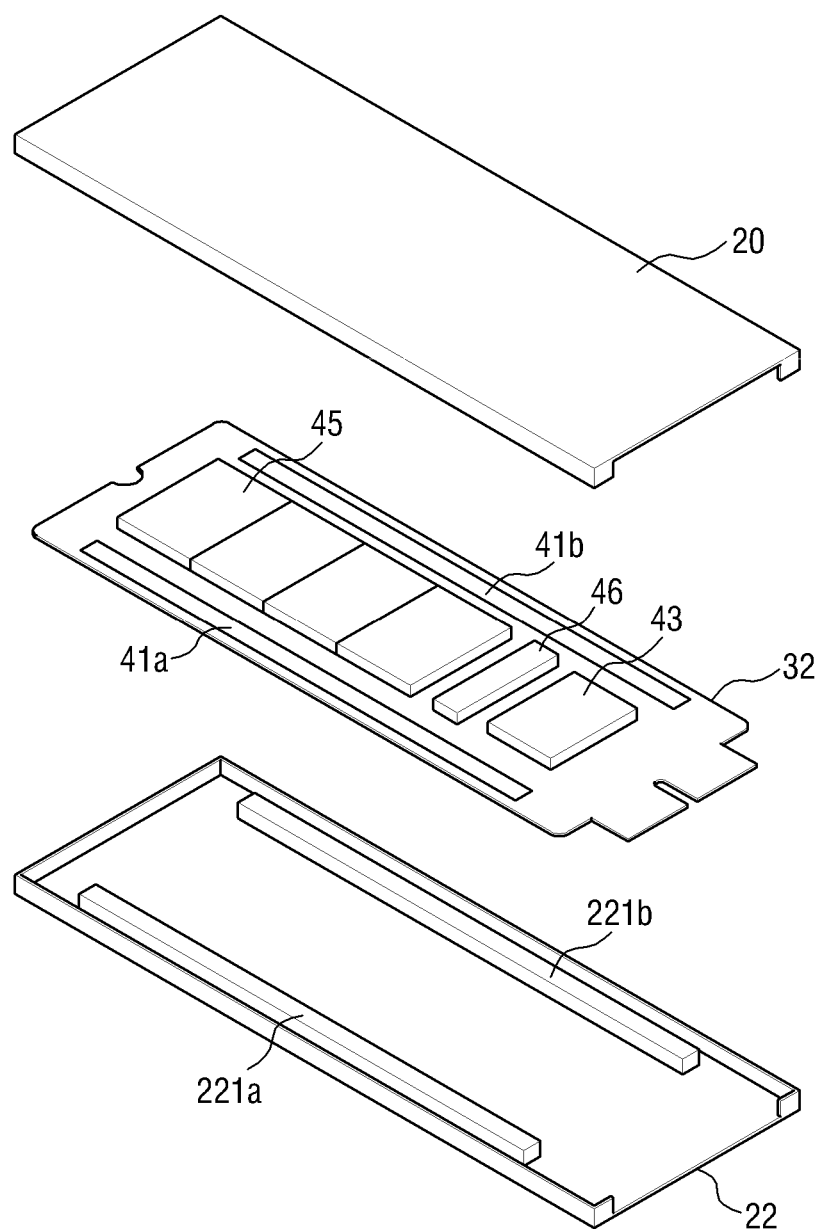
FIG. 2A is a view illustrating a semiconductor device according to the present inventive concept, which is applied to a memory module.

FIG. 2A is a view illustrating a semiconductor device according to the present inventive concept, which is applied to a memory module 2.

Referring to FIG. 2A, the semiconductor device includes a circuit board 32 and cases 20 and 22 accommodating the circuit board 32. Specifically, the semiconductor device may include at least one electronic device, such as a memory module controller 43 or a memory device 45, on the circuit board 32. In some embodiments of the present inventive concept, the circuit board 32 may be a PCB.

The memory module controller 43 may read data that is stored in the memory device 45 and transmit the read data to a host (not shown) in accordance with a read command that is received from the host. Further, the memory module controller 43 may store data that is transmitted from the host in the memory device 45 in accordance with a write command that is received from the host. In some embodiments of the present inventive concept, the memory module 2 may further include a buffer memory device 46 to heighten the data transfer efficiency between the memory module controller 43 and the memory device 45.

The cases 20 and 22 may be formed to surround the circuit board 32. As illustrated in FIG. 2, the cases 20 and 22 may be composed of two components including an upper plate and a lower plate, but are not limited thereto. The cases 20 and 22 may include projection portions 221a and 221b formed on inner surfaces thereof. The projection portions 221a and 221b may come in contact with the circuit board 32 in contact regions 41a and 41b, respectively, formed on the circuit board 32 to make the cases 20 and 22 come in contact with the circuit board 32. The cases 20 and 22 may include a metal having superior thermal conductivity so that they can be soldered. For example, in some embodiments of the present inventive concept, the cases 20 and 21 may include copper (Cu) or a clad metal that is composed of copper (Cu) and aluminum (Al). The projection portions 221a and 221b may also be made of the same material as the cases 10 and 12.

Figure 2B:
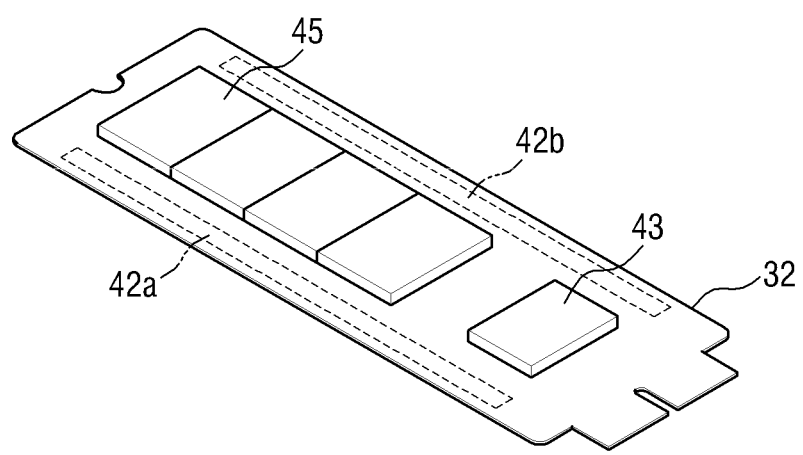
FIG. 2B is a view illustrating a semiconductor device according to the present inventive concept, which is applied to a non-case type SSD.

FIG. 2B is a view illustrating a semiconductor device according to the present inventive concept, which is applied to a non-case type SSD.

Referring to FIG. 2B, as described above with reference to FIG. 2A, a non-case type SSD 2' may include at least one electronic device, such as a memory module controller 43 or a memory device 45, on the circuit board 32. The non-case type SSD 2' is different from the memory module 2 in at least the sense that the non-case type SSD 2' has no case surrounding the circuit board 32, and stiffener portions 42a and 42b are formed inside the circuit board 32 instead of the contact regions 41a and 41b of the cases that are formed on the circuit board 32. Since the stiffener portions 42a and 42b are inserted into the circuit board 32, the stiffness of the circuit board is improved, and thus, deformation of the circuit board caused by, for example, thermal deformation, can be prevented. The details thereof are described below with reference to FIGS. 6 to 8.

Figure 3:
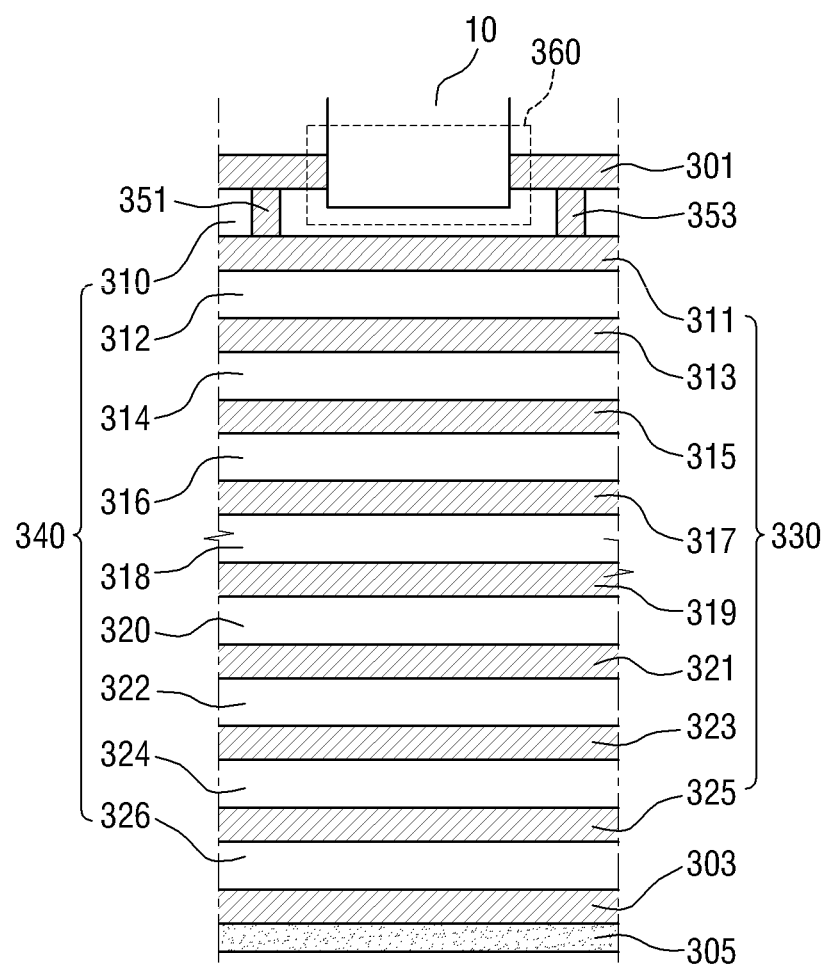
FIG. 3 is a view illustrating a vertical cross-section of a circuit board that is used in a semiconductor device according to a first embodiment of the present inventive concept.

FIG. 3 is a view illustrating a vertical cross-section of a circuit board that is used in a semiconductor device according to a first embodiment of the present inventive concept.

Referring to FIG. 3, a circuit board that is used in a semiconductor device 3 according to a first embodiment of the present inventive concept may include a first outer layer 301, a second outer layer 303, and a plurality of inner layers (e.g., 330 and 340) formed to be stacked between the first outer layer 301 and the second outer layer 303. Specifically, in some embodiments of the present inventive concept, the plurality of inner layers may be formed by alternately stacking conductive layers 330 and insulating layers 340. For example, the conductive layers 330 may include ground layers 311, 315, 321, and 325 forming an electric potential basis of other layers. In addition, the conductive layers 330 may include signal layers 313, 317, 319, and 323 for signal transmission between the electronic devices formed in the circuit board. Further, the insulating layers 340 for insulation between the conductive layers 330 may be formed between the respective conductive layers 330. However, the detailed structure of the plurality of inner layers of the circuit board according to various embodiments of the present inventive concept is not limited to the above-described contents. In some embodiments, a Photo-imageable Solder Resist (PSR) layer 305 may be formed on the surface of the second outer layer 303 as an insulating layer. In some embodiments of the present inventive concept, the first outer layer 301, the second outer layer 303, and the conductive layers 330 may include a material having superior thermal conductivity, for example, such as copper (Cu).

The first outer layer 301 of the semiconductor device 3 according to the first embodiment of the present inventive concept may include a contact region 360 that comes in contact with the case 10 that surrounds the circuit board. As described above with reference to FIG. 1, projection portions may be formed on the inner surface of the case 10, and the projection portions may come in contact with the first outer layer 301 in the contact region 360. Specifically, the first outer layer 301 may include at least one opening into which a part of the case 10 (i.e., the projection portion that is formed on the inner surface of the case 10) is inserted. The projection portion of the case 10 may be soldered after being inserted into the opening or may form a contact using conductive epoxy. In the case where the PSR layer is formed on the surface of the first outer layer 301, at least a part of the PSR layer may be removed, and then the opening may be formed. Alternatively, the surface of the first outer layer 301 may include a first region where electronic devices are formed and a second region where the electronic devices are not formed, and at least one opening may be formed in the second region. In other words, the contact region 360 that is formed by the first outer layer 301 and the case 10 may be formed in the region where the electronic devices are not formed on the circuit board.

Further, the first outer layer 301 of the semiconductor device 3 according to the first embodiment of the present inventive concept is connected to the ground layer 311. For example, the first outer layer 301 may be connected to the ground layer 311 through one or more via-holes 351 and 353. Because the first outer layer 301, which forms the contact region 360 together with the case 10, is connected to the ground layer 311, the case 10 is connected to the ground layer 311 of the circuit board of the semiconductor device 3 through the first outer layer 301. Accordingly, heat that is generated from the electronic devices formed on the circuit board of the semiconductor device 3 according to the first embodiment of the present inventive concept may be transferred along the ground layer 311, the first outer layer 301, and/or the case 10, and then may be dissipated out of the case 10.

Figure 4:
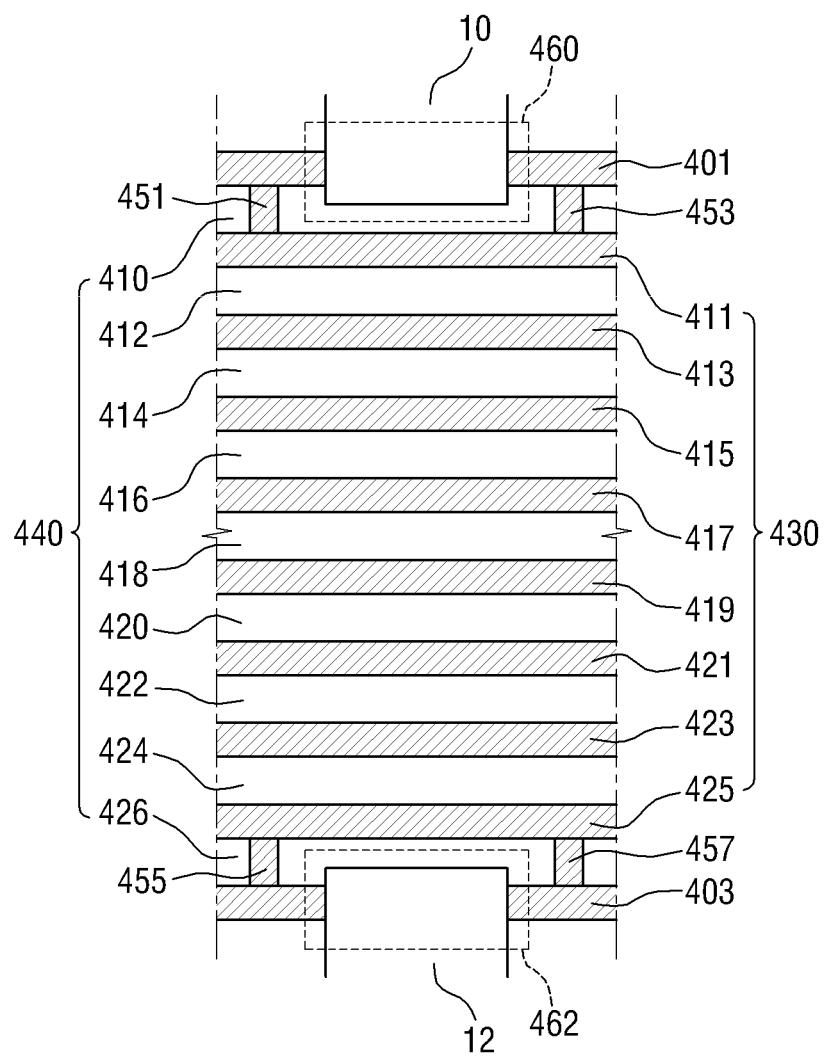
FIG. 4 is a view illustrating a vertical cross-section of a circuit board that is used in a semiconductor device according to a second embodiment of the present inventive concept.

FIG. 4 is a view illustrating a vertical cross-section of a circuit board that is used in a semiconductor device according to a second embodiment of the present inventive concept.

Referring to FIG. 4, a circuit board that is used in a semiconductor device 4 according to a second embodiment of the present inventive concept may include a first outer layer 401, a second outer layer 403, and a plurality of inner layers (e.g., 430 and 440) formed to be stacked between the first outer layer 401 and the second outer layer 403. Specifically, in some embodiments of the present inventive concept, the plurality of inner layers may be formed by alternately stacking conductive layers 430 and insulating layers 440. For example, the conductive layers 430 may include ground layers 411, 415, 421, and 425 forming an electric potential basis of other layers, and signal layers 413, 417, 419, and 423 for signal transmission between the electronic devices formed in the circuit board. Further, the insulating layers 440 for insulation between the conductive layers 430 may be formed between the respective conductive layers 430. However, the detailed structure of the plurality of inner layers of the circuit board according to various embodiments of the present inventive concept is not limited to the above-described contents.

In the semiconductor device 4 according to the second embodiment of the present inventive concept, the first outer layer 401 may include a first contact region 460 that comes in contact with the case 10 that surrounds the circuit board. The second outer layer 403 may include a second contact region 462 that comes in contact with the case 12 that surrounds the circuit board. As described above with reference to FIG. 1, projection portions are formed on the inner surfaces of the cases 10 and 12, and the projection portions may come in contact with the first outer layer 401 and the second outer layer 403 to form the first contact region 460 and the second contact region 462. In the case where the PSR layer is formed on the surfaces of the first outer layer 401 and the second outer layer 403, at least a part of the PSR layer may be removed, and then the first contact region 460 and the second contact region 462 may be formed.

In the semiconductor device 4 according to the second embodiment of the present inventive concept, the first outer layer 401 is connected to the ground layer 411, and the second outer layer 403 is connected to the ground layer 425. For example, the first outer layer 401 may be connected to the ground layer 411 through one or more via-holes 451 and 453, and the second outer layer 403 may be connected to the ground layer 425 through one or more via-holes 455 and 457. Because the first outer layer 401, which forms the first contact region 460 together with the case 10, is connected to the ground layer 411, the case 10 is connected to the ground layer 411 of the circuit board of the semiconductor device 4 through the first outer layer 401. Further, because the second outer layer 403, which forms the second contact region 462 together with the case 12, is connected to the ground layer 425, the case 12 is connected to the ground layer 425 of the circuit board of the semiconductor device 4 through the second outer layer 403. Accordingly, heat that is generated from the electronic devices formed on the circuit board of the semiconductor device 4 may be transferred along the ground layers 411 and/or 425, the first outer layer 401 and/or the second outer layer 403, and the cases 10 and/or 12, and then may be dissipated out of the cases 10 and 12, according to the second embodiment of the present inventive concept.

Figure 5:
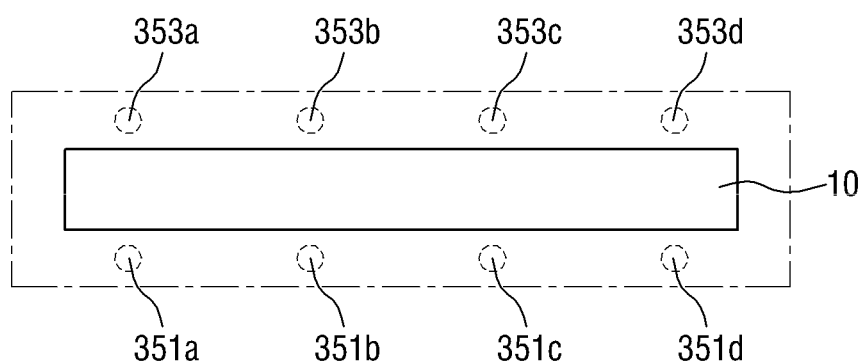
FIG. 5 is a view illustrating a part of an upper surface of a circuit board that is used in a semiconductor device according to the first embodiment of the present inventive concept.

FIG. 5 is a view illustrating a part of an upper surface of a circuit board that is used in a semiconductor device according to the first embodiment of the present inventive concept.

Referring to FIG. 5, in the circuit board that is used in the semiconductor device 3 according to the first embodiment of the present inventive concept, the case 10 comes in contact with the first outer layer 301, and the first outer layer 301 is connected to the ground layer 311 through one or more via-holes 351a, 351b, 351c, 351d, 353a, 353b, 353c, and 353d. Accordingly, the case 10 may be connected to the ground layer 311 of the circuit board of the semiconductor device 3 through the first outer layer 301, and thus the heat that is generated from the electronic devices formed on the circuit board of the semiconductor device 3 is transferred along the ground layer 311, the first outer layer 301, and/or the case 10.

Figure 6:
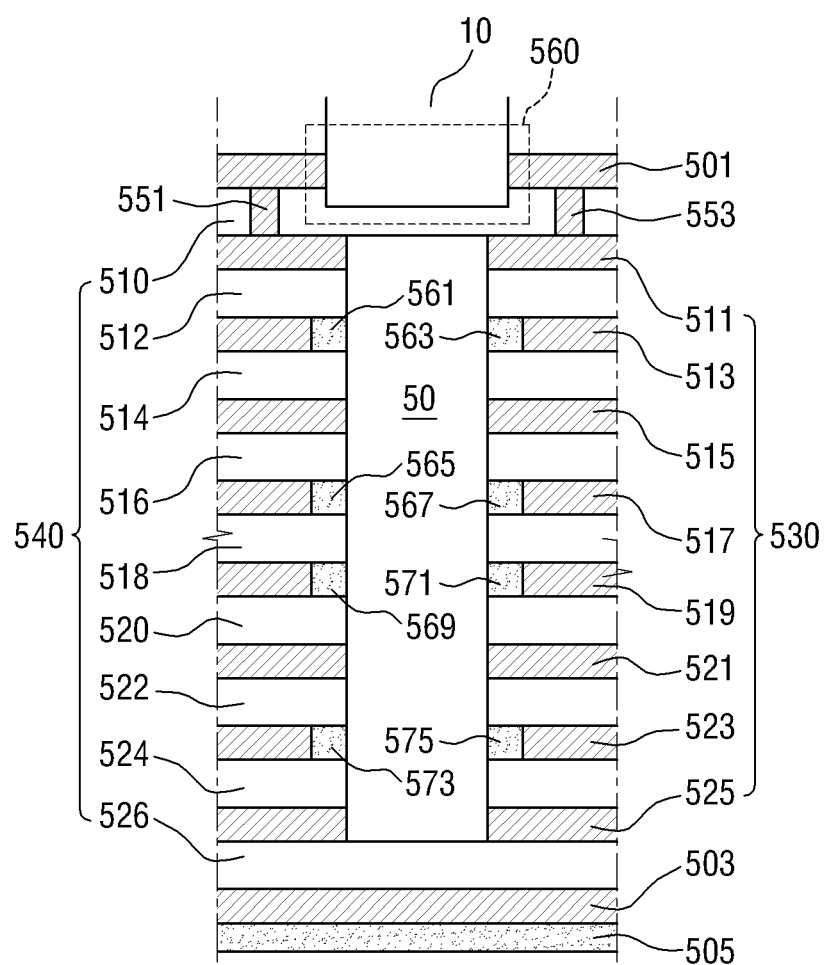
FIG. 6 is a view illustrating a vertical cross-section of a circuit board that is used in a semiconductor device according to a third embodiment of the present inventive concept.

FIG. 6 is a view illustrating a vertical cross-section of a circuit board that is used in a semiconductor device according to a third embodiment of the present inventive concept.

Referring to FIG. 6, a circuit board that is used in a semiconductor device 5 according to a third embodiment of the present inventive concept may include a first outer layer 501, a second outer layer 503, a plurality of inner layers (e.g., 530 and 540) formed to be stacked between the first outer layer 501 and the second outer layer 503, and a stiffener 50. Specifically, in some embodiments of the present inventive concept, the plurality of inner layers may be formed by alternately stacking conductive layers 530 and insulating layers 540. For example, the conductive layers 530 may include ground layers 511, 515, 521, and 525 forming an electric potential basis of other layers, and signal layers 513, 517, 519, and 523 for signal transmission between the electronic devices formed in the circuit board. Further, the insulating layers 540 for insulation between the conductive layers 530 may be formed between the respective conductive layers 530. However, the detailed structure of the plurality of inner layers of the circuit board according to various embodiments of the present inventive concept is not limited to the above-described contents. Moreover, a PSR layer 505 may be formed on the surface of the second outer layer 503 as an insulating layer.

In the semiconductor device 5 according to the third embodiment of the present inventive concept, as described above with reference to FIG. 3, the first outer layer 501 may include a contact region 560 that comes in contact with the case 10. Accordingly, the case 10 may be connected to the ground layer 511 of the circuit board of the semiconductor device 5 through the first outer layer 501, and thus, heat that is generated from the electronic devices formed on the circuit board of the semiconductor device 5 is transferred along the ground layer 511, the first outer layer 501, and/or the case 10.

In the semiconductor device 5 according to the third embodiment of the present inventive concept, the stiffener 50 may be formed in the circuit board of the semiconductor device 5. Specifically, the stiffener 50 may be formed between the first outer layer 501 and the second outer layer 503, and may be formed to penetrate the plurality of stacked inner layers. In some embodiments of the present inventive concept, the horizontal cross-section of the stiffener 50 may overlap the contact region 560. The surfaces of the first outer layer 501 and the second outer layer 503 may include a first region where electronic devices are formed and a second region where the electronic devices are not formed. The stiffener 50 may be formed between the first outer layer 501 and the second outer layer 503 in the second region. In other words, the stiffener 50 may be formed inside the region where the electronic devices are not formed on the circuit board. In some embodiments of the present inventive concept, the stiffener 50 may include a material having superior stiffness and thermal conductivity, for example, such as copper (Cu) or aluminum (Al).

The stiffener 50 may be connected to the ground layers 511, 515, 521, and 525 among the plurality of inner layers of the circuit board. Accordingly, the stiffener 50 may form ground portions of the circuit board together with the ground layers 511, 515, 521, and 525. In contrast, the stiffener 50 may be insulated from the signal layers 513, 517, 519, and 523 among the plurality of inner layers of the circuit board. Specifically, by forming insulating regions 561, 563, 565, 567, 569, 571, 573, and 575 between the stiffener 50 and the signal layers 513, 517, 519, and 523, the stiffener 50 can be insulated from the signal layers 513, 517, 519, and 523. Since the stiffener 50 is inserted into the circuit board, the stiffness of the circuit board is improved, and thus deformation of the circuit board caused by, for example, thermal deformation of the circuit board, can be prevented.

Figure 7:
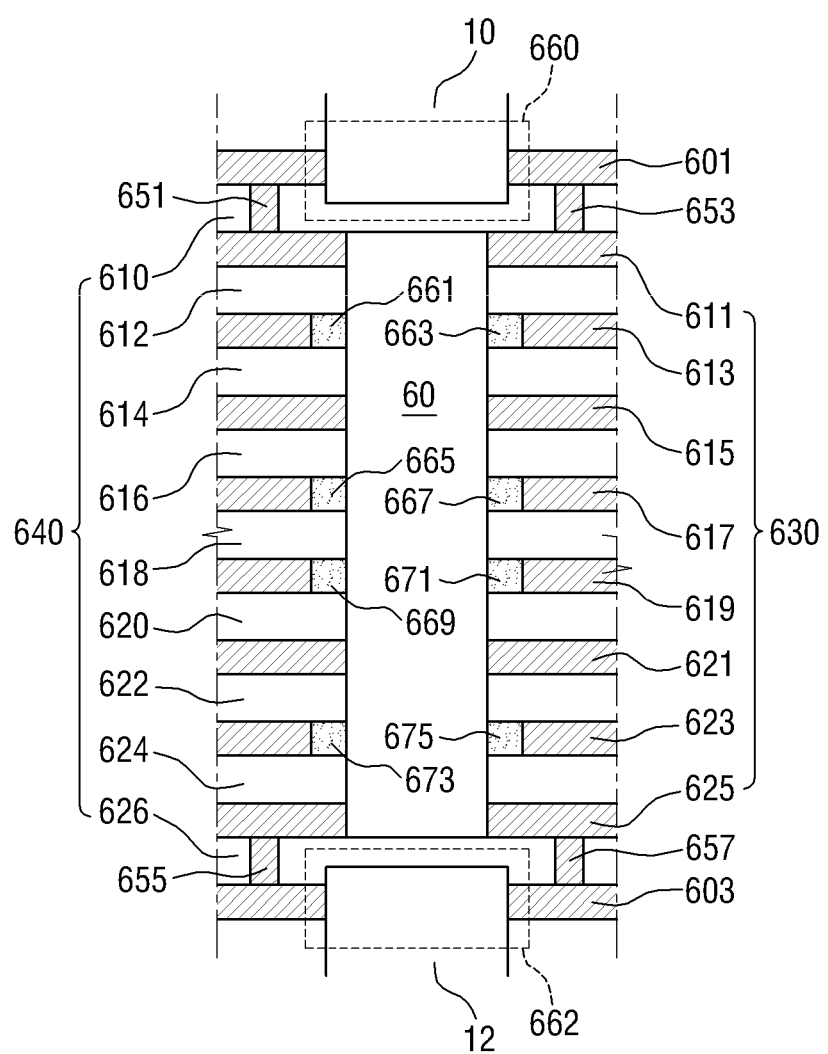
FIG. 7 is a view illustrating a vertical cross-section of a circuit board that is used in a semiconductor device according to a fourth embodiment of the present inventive concept.

FIG. 7 is a view illustrating a vertical cross-section of a circuit board that is used in a semiconductor device according to a fourth embodiment of the present inventive concept.

Referring to FIG. 7, a circuit board that is used in a semiconductor device 6 according to a fourth embodiment of the present inventive concept may include a first outer layer 601, a second outer layer 603, a plurality of inner layers (e.g., 630 and 640) formed to be stacked between the first outer layer 601 and the second outer layer 603, and a stiffener 60. Specifically, in some embodiments of the present inventive concept, the plurality of inner layers may be formed by alternately stacking conductive layers 630 and insulating layers 640. For example, the conductive layers 630 may include ground layers 611, 615, 621, and 625 forming an electric potential basis of other layers, and signal layers 613, 617, 619, and 623 for signal transmission between the electronic devices formed in the circuit board. Further, the insulating layers 640 for insulation between the conductive layers 630 may be formed between the respective conductive layers 630. However, the detailed structure of the plurality of inner layers of the circuit board according to various embodiments of the present inventive concept is not limited to the above-described contents.

In the semiconductor device 6 according to the fourth embodiment of the present inventive concept, as described above with reference to FIG. 4, the first outer layer 601 may include a first contact region 660 that comes in contact with the case 10 and a second contact region 662 that comes in contact with the case 12. Accordingly, the cases 10 and 12 are connected to the ground layers 611 and 625 of the circuit board of the semiconductor device 6 through the first outer layer 601 and the second outer layer 602, respectively, and thus heat that is generated from the electronic devices formed on the circuit board of the semiconductor device 6 is transferred along the ground layers 611 and/or 625, the first outer layer 601 and/or the second outer layer 603, and the cases 10 and/or 12.

In the semiconductor device 6 according to the fourth embodiment of the present inventive concept, the stiffener 60 may be formed in the circuit board of the semiconductor device 6. Specifically, the stiffener 60 may be formed between the first outer layer 601 and the second outer layer 603, and may be formed to penetrate the plurality of stacked inner layers. In some embodiments of the present inventive concept, the horizontal cross-section of the stiffener 60 may overlap the first contact region 660 and the second contact region 662.

The stiffener 60 may be connected to the ground layers 611, 615, 621, and 625 among the plurality of inner layers of the circuit board. Accordingly, the stiffener 60 may form ground portions of the circuit board together with the ground layers 611, 615, 621, and 625. In contrast, the stiffener 60 may be insulated from the signal layers 613, 617, 619, and 623 among the plurality of inner layers of the circuit board. Specifically, by forming insulating regions 661, 663, 665, 667, 669, 671, 673, and 675 between the stiffener 60 and the signal layers 613, 617, 619, and 623, the stiffener 60 can be insulated from the signal layers 613, 617, 619, and 623. Since the stiffener 60 is inserted into the circuit board, the stiffness of the circuit board is improved, and thus deformation of the circuit board caused by, for example, thermal deformation of the circuit board, can be prevented. In addition, since the stiffener 60 is connected to the ground layers 611 and 625, and the ground layers 611 and 625 are connected to the first outer layer 601 that comes in contact with the case 10 and with the second outer layer 603 that comes in contact with the case 12, respectively, heat that is generated from the electronic devices formed on the circuit board can be dissipated to out of the cases 10 and/or 12.

Figure 8A:
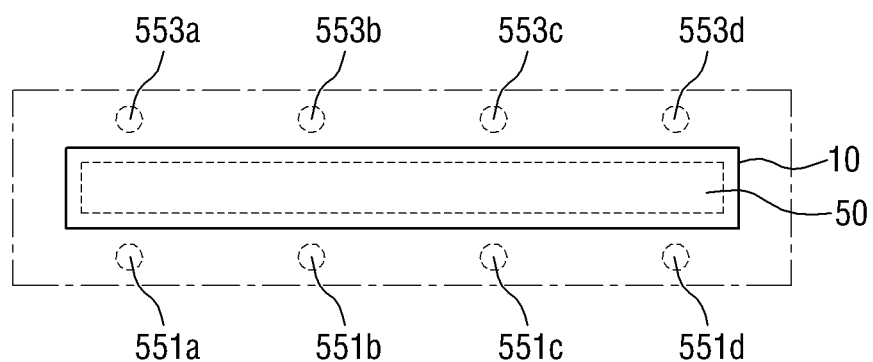
FIG. 8A is a view illustrating a part of an upper surface of a circuit board that is used in a semiconductor device according to the third embodiment of the present inventive concept.

FIG. 8A is a view illustrating a part of an upper surface of a circuit board that is used in a semiconductor device according to the third embodiment of the present inventive concept.

Referring to FIG. 8A, in the circuit board that is used in the semiconductor device 5 according to the third embodiment of the present inventive concept, the case 10 comes in contact with the first outer layer 501, and the first outer layer 501 is connected to the ground layer 511 through one or more via-holes 551*a*, 551*b*, 551*c*, 551*d*, 553*a*, 553*b*, 553*c*, and 553*d*. Accordingly, the case 10 is connected to the ground layer 511 of the circuit board of the semiconductor device 5 through the first outer layer 501, and thus, the heat that is generated from the electronic devices formed on the circuit board of the semiconductor device 5 is transferred along the ground layer 511, the first outer layer 501, and/or the case 10. Further, the stiffener 50 may be formed so that the horizontal cross-section thereof overlaps the case 10 or the contact region 560.

Figure 8B:
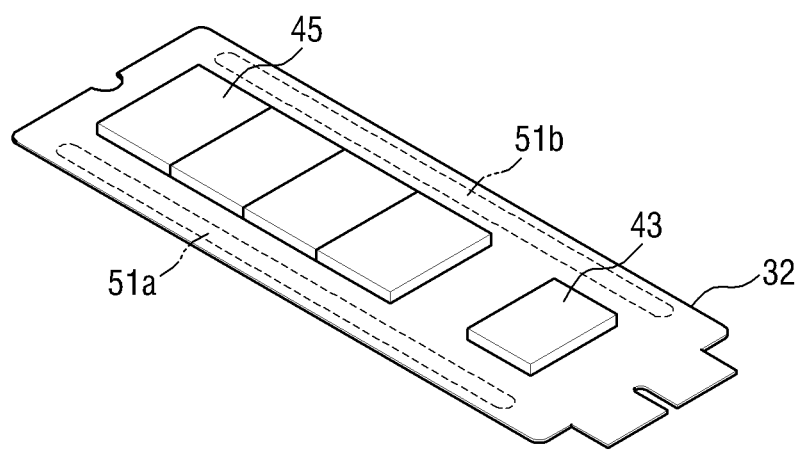
FIGS. 8B and 8C are views illustrating application examples of stiffeners according to various embodiments of the present inventive concept.
Figure 8C:
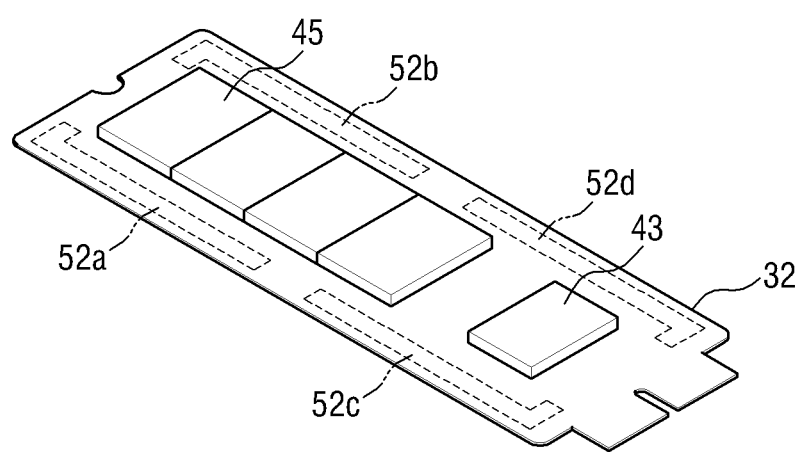

FIGS. 8B and 8C are views illustrating application examples of stiffeners according to various embodiments of the present inventive concept.

Referring to FIG. 8B, a semiconductor device 7 may include one or more electronic devices, such as a memory module controller 43 and a memory device 45, on the circuit board 32. Stiffener portions 51*a* and 51*b* may be formed inside the circuit board 32. In some embodiments of the present inventive concept, as illustrated in FIG. 8B, the stiffener portions 51a and 51b may have rounded end portions.

Referring to FIG. 8C, stiffener portions 52a, 52b, 52c, and 52d may be formed inside the circuit board of a semiconductor device 8, and the stiffener portions 52a, 52b, 52c, and 52d may be in a folded or bent shape.

However, the stiffeners used in various embodiments of the present inventive concept are not limited to the shapes and positions of the stiffeners as illustrated in FIGS. 2B, 8B, and 8C. For example, the cross-section of the stiffener may have any other suitable shape in addition to the bar shape or the bent shape as described above, and the end portion of the stiffener may have any other suitable shape in addition to the rounded shape as described above. FIGS. 2B, 8B, and 8C illustrate that the stiffeners are formed mainly on the outline of the circuit board. However, the position where the stiffener is formed is not limited thereto, and the stiffener may be formed in any place where insulation from the electronic devices is possible in the circuit board.

Figure 9:
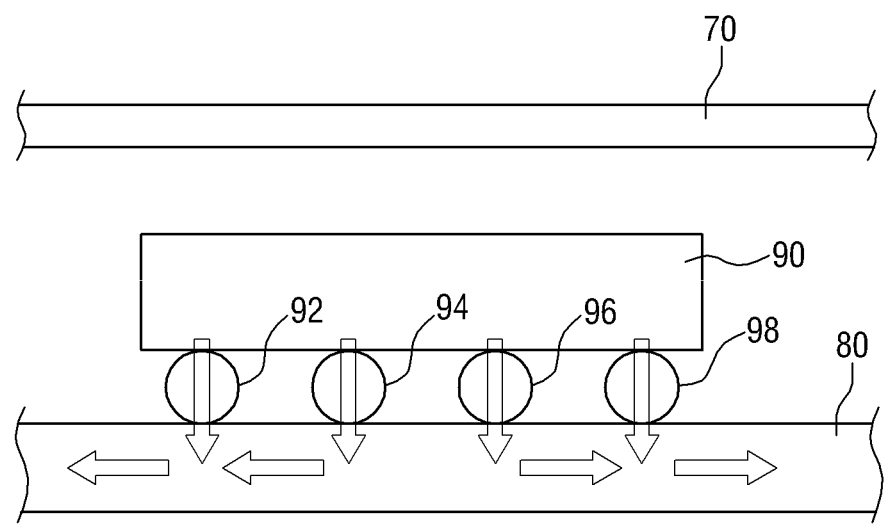
FIGS. 9 and 10 are views illustrating heat dissipation paths of a semiconductor device according to various embodiments of the present inventive concept.
Figure 10:
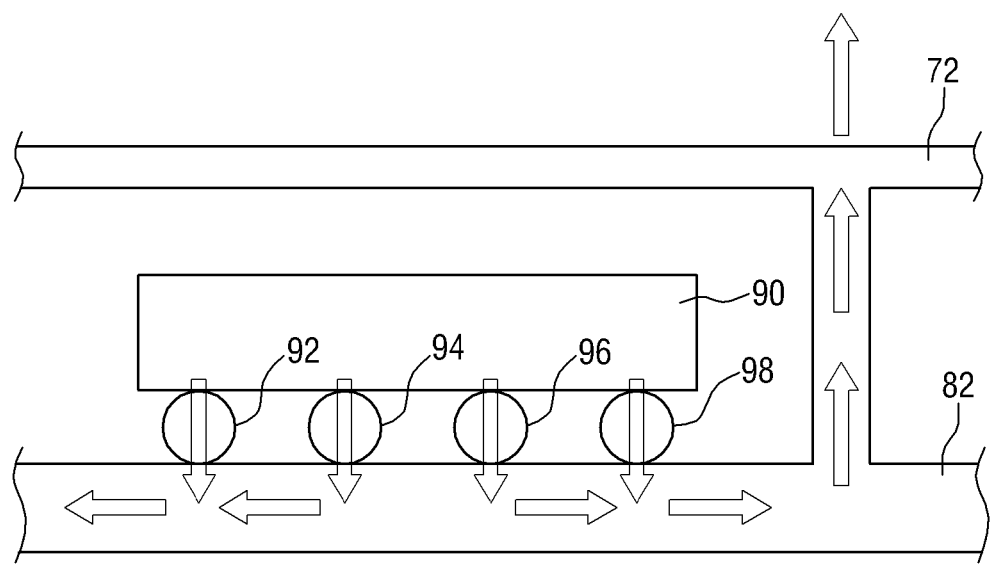
Figure 11:
FIGS. 11 and 12 are views explaining effects of stiffeners included in a semiconductor device according to various embodiments of the present inventive concept.
Figure 12:
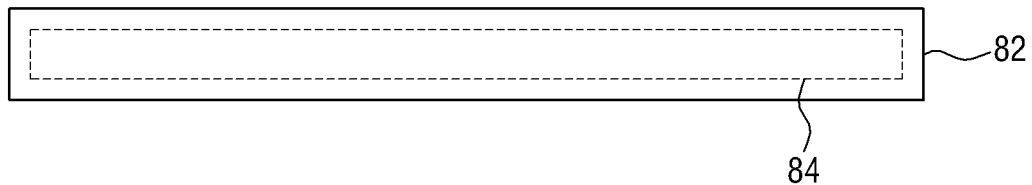

FIGS. 9 and 10 are views illustrating heat dissipation paths of a semiconductor device according to various embodiments of the present inventive concept, and FIGS. 11 and 12 are views explaining effects of stiffeners included in a semiconductor device according to various embodiments of the present inventive concept.

Referring to FIG. 9, a semiconductor package 90 includes one or more balls 92, 94, 96, and 98. The semiconductor package 90 may be mounted on a circuit board 80 through the balls 92, 94, 96, and 98. The circuit board 80 and the semiconductor package 90 are accommodated in a case 70 that surrounds them. Heat that is generated from electronic devices include in the semiconductor package 90 is discharged in all directions from the center of the semiconductor package 90, and most heat (e.g., about 90% of heat) generated from the semiconductor package 90 is transferred to the circuit board 80 through the balls 92, 94, 96, and 98.

Referring to FIG. 10, in the semiconductor device according to various embodiments of the present inventive concept, the heat of the semiconductor package 90 that is transferred to the circuit board 82 through the balls 92, 94, 96, and 98 may be discharged out of the case 72 along a thermally conductive case 72 that is cladded to the circuit board 82. Accordingly, the heat that is generated from the semiconductor package 90 may be discharged to an outside environment to promptly cool down the semiconductor package. Further, since it is not necessary to insert any material for heat dissipation into the semiconductor package 90, the cost can be saved, and the productivity can be increased.

Referring to FIG. 11, it can be seen that the circuit board 80 that includes a plurality of layers is deformed to be spaced apart from a horizontal reference surface 81. For example, the circuit board 80 may be deformed due to the heat that is generated from the electronic devices included in the circuit board 80 or due to a defect occurring in a fabricating process. If the circuit board 80 is deformed, even the electronic devices, such as capacitors, included in the circuit board 80 may have defects. To prevent this, referring to FIG. 12, in the semiconductor device according to various embodiments of the present inventive concept, a stiffener 84 may be formed inside the circuit board 82, and due to high stiffness of the stiffener 84, the deformation of the circuit board 82 is prevented to improve the reliability of the semiconductor device.

Figure 13:
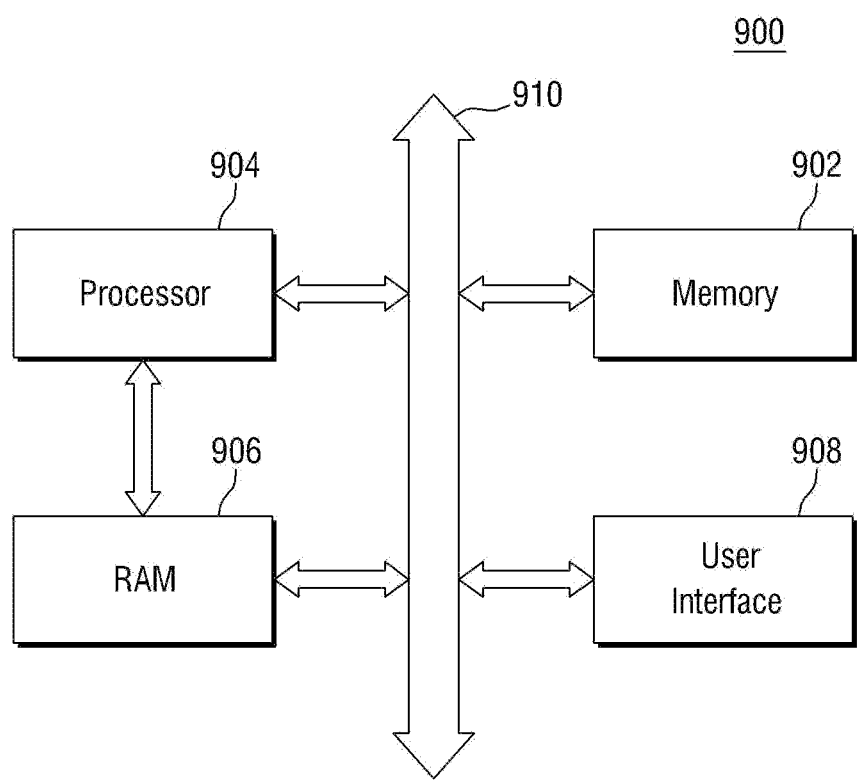
FIG. 13 is a block diagram illustrating an electronic system to which a semiconductor device according to various embodiments of the present inventive concept is applied.

FIG. 13 is a block diagram illustrating an electronic system to which a semiconductor device according to various embodiments of the present inventive concept is applied.

Referring to FIG. 13, an electronic system 900 may adopt a semiconductor package according to embodiments of the present inventive concept as described above. Specifically, the electronic system 900 may include a memory 902, a processor 904, a RAM 906, and a user interface 908.

The memory 902, the processor 904, the RAM 906, and the user interface 908 may perform data communication with each other using a bus 910.

The processor 904 may serve to execute a program and to control the electronic system 900, and the RAM 906 may be used as an operating memory of the processor 904. The processor 904 and the RAM 906 may be implemented according to a method for fabricating a semiconductor device according to embodiments of the present inventive concept as described above.

The user interface 908 may be used to input data to or to output data from the electronic system 900. The memory system 902 may store codes for an operation of the processor 904, data processed by the processor 904, or externally input data therein.

The memory 902 may include a separate controller for driving, and may be configured to additionally include an error correction block. The error correction block may be configured to detect and correct errors of the data stored in the memory 902.

The memory 902 may be integrated into one semiconductor device to form a memory card. For example, the memory 902 may be integrated into one semiconductor device, and form a memory card, such as a PC card (e.g., Personal Computer Memory Card International Association (PCMCIA)), a compact flash card CF, a smart media card (e.g., SM and SMC), a memory stick, a multimedia card (e.g., MMC, RS-MMC, and MMCmicro), an SD card (e.g., SD, miniSD, and microSD, and SDHC), or a universal flash storage device (UFS).

Although preferred embodiments of the present inventive concept have been described for illustrative purposes, those skilled in the art will appreciate that various modifications, additions and substitutions are possible, without departing from the scope and spirit of the inventive concept as disclosed in the accompanying claims.

What is claimed is:

1. A semiconductor device, comprising:
   a circuit board including a first outer layer, a contact region in the first outer layer, a second layer formed on an opposite side of the first outer layer, at least one via-hole, and a plurality of inner layers formed to be stacked between the first layer and the second layer; and
   a case accommodating the circuit board, the case having a projection portion that is configured to come in contact with the circuit board in the contact region,
   wherein the plurality of inner layers includes at least one ground layer,
   the first outer layer is connected to the at least one ground layer through the at least one via-hole; and
   the case is connected to the at least one ground layer through the first outer layer,
   wherein the circuit board comprises a stiffener that is formed between the first outer layer and the second outer layer, and the stiffener penetrates the plurality of stacked inner layers.

2. The semiconductor device of claim 1, wherein the first outer layer has at least one opening into which the projection portion of the case is inserted.

3. The semiconductor device of claim 2, wherein a surface of the first outer layer comprises a first region where electronic devices are formed and a second region where the electronic devices are not formed, and
the at least one opening is formed in the second region.

4. The semiconductor device of claim 1, wherein a surface of each of the first outer layer and the second outer layer comprise a first region where electronic devices are formed and a second region where the electronic devices are not formed, and
the stiffener is formed between the first outer layer and the second outer layer in the second region.

5. The semiconductor device of claim 1, wherein the stiffener is connected to the at least one ground layer.

6. The semiconductor device of claim 1, wherein the plurality of inner layers comprise at least one signal layer, and
the stiffener is insulated from the at least one signal layer.

7. The semiconductor device of claim 1, wherein the stiffener includes at least one of copper (Cu) or aluminum (Al).

8. The semiconductor device of claim 1, wherein the case includes at least one of (a) copper (Cu) or (b) a clad metal composed of copper (Cu) and aluminum (Al).

9. The semiconductor device of claim 1, wherein heat that is generated from the circuit board is transferred to the case through the ground layer.

10. A semiconductor device, comprising:
a circuit board including a first outer layer, a second layer formed on an opposite side of the first outer layer, and a plurality of inner layers formed to be stacked between the first layer and the second layer;
a stiffener penetrating the plurality of inner layers; and
a case including a first portion and a second portion, the case accommodating the circuit board,
wherein the first portion of the case is configured to contact the first outer layer in a first contact region,
the second portion of the case is configured to contact the second outer layer in a second contact region that faces the first contact region,
the case is connected to a first ground layer and a second ground layer included in the plurality of inner layers through the first outer layer and the second outer layer, respectively, and
the stiffener is formed between the first contact region and the second contact region.

11. The semiconductor device of claim 10, wherein parts of horizontal cross-sections of the first contact region and the second contact region overlap a horizontal cross-section of the stiffener.

12. The semiconductor device of claim 10, wherein a surface of each of the first outer layer and the second outer layer comprise a first region where electronic devices are formed and a second region where the electronic devices are not formed, and
the first contact region is formed in the second region of the first outer layer, and
the second contact region is formed in the second region of the second outer layer.

13. The semiconductor device of claim 10, wherein the first outer layer has a first opening into which the first portion of the case is inserted, and
the second outer layer has a second opening into which the second portion of the case is inserted.

14. The semiconductor device of claim 13, wherein the first outer layer and the second outer layer are respectively connected to the first ground layer and the second ground layer through a via-hole,
the first portion of the case inserted into the first opening is connected to the first ground layer through the first outer layer, and
the second portion of the case inserted into the second opening is connected to the second ground layer through the second outer layer.

15. A semiconductor device, comprising:
a circuit board including a first outer layer, a second outer layer, a plurality of inner layers, and a stiffener; and
a case configured to accommodate the circuit board,
wherein the first outer layer includes a first contact region configured to contact the case,
the second outer layer includes a second contact region configured to contact the case,
the stiffener is formed between the first outer layer and the second outer layer, and penetrates the plurality of inner layers,
the plurality of layers includes a plurality of ground layers and a plurality of signal layers, and
the stiffener is connected to the plurality of ground layers and insulated from the plurality of signal layers.

16. The semiconductor device of claim 15, further comprising:
insulating regions disposed between the stiffener and the plurality of signal layers.

17. The semiconductor device of claim 15, wherein the stiffener includes at least one of copper (Cu) or aluminum (Al).

18. The semiconductor device of claim 15, wherein the stiffener is configured to prevent thermal deformation of the circuit board.

19. The semiconductor device of claim 15, further comprising:
one or more electronic devices formed in or on the circuit board, wherein the plurality of ground layers, the first outer layer, the second outer layer, and the case are configured to dissipate heat away from the one or more electronic devices.

* * * * *